United States Patent
Buckhurst et al.

(10) Patent No.: US 9,103,874 B2
(45) Date of Patent: *Aug. 11, 2015

(54) CONCURRENT TEST INSTRUMENTATION

(75) Inventors: David W. Buckhurst, Knutsford (GB); Michael T. Cartmell, Lytham St. Annes (GB)

(73) Assignee: International Business Machines Corporation, Armonk, NY (US)

( * ) Notice: Subject to any disclaimer, the term of this patent is extended or adjusted under 35 U.S.C. 154(b) by 777 days.

This patent is subject to a terminal disclaimer.

(21) Appl. No.: 13/346,138

(22) Filed: Jan. 9, 2012

(65) Prior Publication Data
US 2013/0179735 A1   Jul. 11, 2013

(51) Int. Cl.
*G06F 9/44*    (2006.01)
*G01R 31/28*   (2006.01)
*G01R 19/25*   (2006.01)

(52) U.S. Cl.
CPC ........ G01R 31/2834 (2013.01); G01R 19/2516 (2013.01)

(58) Field of Classification Search
CPC ....................................................... G06F 9/44
USPC ......................................... 717/130, 131, 154
See application file for complete search history.

(56) References Cited

U.S. PATENT DOCUMENTS

| | | | |
|---|---|---|---|
| 4,802,164 A | | 1/1989 | Fukuoka et al. |
| 5,390,330 A | * | 2/1995 | Talati ............................ 717/104 |
| 5,706,506 A | | 1/1998 | Jensen et al. |
| 5,758,061 A | * | 5/1998 | Plum ............................... 714/35 |
| 5,860,009 A | * | 1/1999 | Uchihira et al. ............... 717/149 |
| 5,950,003 A | * | 9/1999 | Kaneshiro et al. ............ 717/130 |
| 6,031,990 A | * | 2/2000 | Sivakumar et al. ........... 717/124 |
| 6,085,034 A | | 7/2000 | Danforth |
| 6,092,079 A | | 7/2000 | Gerard et al. |
| 6,182,107 B1 | * | 1/2001 | Atsatt ........................... 718/100 |
| 6,209,128 B1 | | 3/2001 | Gerard et al. |
| 6,393,481 B1 | * | 5/2002 | Deo et al. ...................... 709/224 |
| 6,595,742 B2 | | 7/2003 | Scimone |
| 6,654,911 B1 | * | 11/2003 | Miles ......................... 714/38.13 |
| 6,698,012 B1 | * | 2/2004 | Kossatchev et al. .......... 717/126 |
| 6,957,421 B2 | | 10/2005 | Hundt et al. |
| 7,028,225 B2 | | 4/2006 | Maso et al. |
| 7,240,258 B1 | * | 7/2007 | Hayes .......................... 714/724 |
| 7,574,697 B2 | | 8/2009 | Biberstein et al. |
| 7,840,844 B2 | * | 11/2010 | Garland et al. ................. 714/33 |

(Continued)

OTHER PUBLICATIONS

Copty, Shady et al., "Toward Automatic Concurrent Debugging Via Minimal Program Mutant Generation With Aspectj", Electronic Notes in Theoretical Computer Science vol. 174, Issue 9, Jun. 22, 2007, URL: http://dx.doi.org/10.1016/j.entcs.2007.04.001 Jun. 22, 2007, 1 page.

(Continued)

*Primary Examiner* — Chat Do
*Assistant Examiner* — Jae Jeon
(74) *Attorney, Agent, or Firm* — DeLizio Law, PLLC

(57) ABSTRACT

A program can be instrumented to test the program. The test instruments are classified, and concurrency constraints applied based on the classifications. A testing tool determines classifications of a plurality of test instruments in the instrumented program. The testing tool prevents concurrent instantiation of multiple of the plurality of test instruments in a first classification of the classifications. Multiple of the plurality of test instruments in a second classification of the classifications are concurrently instantiated.

13 Claims, 4 Drawing Sheets

(56) References Cited

U.S. PATENT DOCUMENTS

| | | | |
|---|---|---|---|
| 2001/0020293 A1* | 9/2001 | Uchihira et al. | 717/4 |
| 2002/0069399 A1* | 6/2002 | Miloushey et al. | 717/108 |
| 2002/0107581 A1 | 8/2002 | Obradovic et al. | |
| 2003/0191869 A1* | 10/2003 | Williams et al. | 709/328 |
| 2004/0181710 A1 | 9/2004 | Sauer et al. | |
| 2004/0230961 A1 | 11/2004 | Biberstein et al. | |
| 2005/0005198 A1 | 1/2005 | Vakrat et al. | |
| 2005/0086022 A1* | 4/2005 | Lindberg et al. | 702/123 |
| 2007/0169055 A1 | 7/2007 | Greifeneder | |
| 2008/0109641 A1* | 5/2008 | Ball et al. | 712/216 |
| 2008/0270998 A1* | 10/2008 | Zambrana | 717/131 |
| 2009/0249285 A1 | 10/2009 | Li et al. | |
| 2009/0249306 A1 | 10/2009 | Li et al. | |
| 2010/0023294 A1* | 1/2010 | Fan et al. | 702/123 |
| 2011/0087634 A1 | 4/2011 | Gallaher et al. | |
| 2011/0099424 A1* | 4/2011 | Trevino et al. | 714/25 |
| 2012/0030515 A1* | 2/2012 | Birakoglu et al. | 714/38.1 |
| 2013/0019126 A1 | 1/2013 | Frohlich et al. | |
| 2013/0117611 A1 | 5/2013 | Chakraborty et al. | |
| 2013/0159978 A1 | 6/2013 | Jazdzewski et al. | |

OTHER PUBLICATIONS

Long, B et al., "Mutation-Based Exploration of a Method for Verifying Concurrent Java Components", Parallel and Distributed Processing Symposium, 2004. Proceedings. 18th International URL: http://dx.doi.org/10.1109/IPDPS.2004.1303338 Apr. 26-30, 2004, 1 page.

Zulkernine, MD, "Towards a Compositional Approach for Automatic Monitoring of Software Systems", Doctoral Dissertation Towards a compositional approach for automatic monitoring of software systems URL: http://portal.acm.org/citation.cfm?id=997262 2003, 2 pages.

Christophe, Guillon, "Program Instrumentation with QEMU", QUF'11—QEMU Open Source Processor Emulator Mar. 18, 2011, 15 pages.

Tzoref, Rachel et al., "Instrumenting Where it Hurts: an Automatic Concurrent Debugging Technique", Proceeding ISSTA '07 Proceedings of the 2007 International Symposium on Software testing and analysis http://portal.acm.org/citation.cfm?id=1273469 Jul. 2007, 11 pages.

"U.S. Appl. No. 13/593,619 Office Action", Oct. 28, 2014, 23 pages.
"U.S. Appl. No. 13/593,619 Office Action", Jul. 15, 2014, 16 pages.
Copty, et al., "Toward Automatic Concurrent Debugging Via Minimal Program Mutant Generation With Aspectj", Electronic Notes in Theoretical Computer Science vol. 174, Issue 9, Jun. 22, 2007, 1 page.

Long, et al., "Mutation-Based Exploration of a Method for Verifying Concurrent Java Components", Parallel and Distributed Processing Symposium, 2004. Proceedings. 18th International, Apr. 26-30, 2004, 1 page.

Zulkernine, "Towards a Compositional Approach for Automatic Monitoring of Software Systems", Doctoral Dissertation Towards a compositional approach for automatic monitoring of software systems, 2003, 2 pages.

* cited by examiner

CONCURRENT TEST INSTRUMENTATION

BACKGROUND

Embodiments of the inventive subject matter generally relate to the field of code instrumentation, and, more particularly, to use of ensuring concurrent test instrument constraint compliance.

Test instrumentation involves inserting test instruments, or instruments, into a program for testing. An instrument can be a single program instruction or a sequence of program instructions. An instrument may invoke a testing program instructions via an application programming interface.

SUMMARY

Embodiments include a method that determines classifications of a plurality of test instruments in the instrumented program. Concurrent instantiation of multiple of the plurality of test instruments in a first classification of the classifications is prevented. Multiple of the plurality of test instruments in a second classification of the classifications are concurrently instantiated.

BRIEF DESCRIPTION OF THE DRAWINGS

The present embodiments may be better understood, and numerous objects, features, and advantages made apparent to those skilled in the art by referencing the accompanying drawings.

FIG. 2 depicts a flowchart of example operations for enforcing concurrent instrument constraints as each code unit of a program is run. FIG. 3 depicts a flowchart of example operations for enforcing concurrent instrument constraints on an instrumented program before running the instrumented program in a test environment.

DESCRIPTION OF EMBODIMENT(S)

The description that follows includes exemplary systems, methods, techniques, instruction sequences and computer program products that embody techniques of the present inventive subject matter. However, it is understood that the described embodiments may be practiced without these specific details. In other instances, well-known instruction instances, protocols, structures and techniques have not been shown in detail in order not to obfuscate the description.

Test instruments in a program can vary in functionality. Some instruments perform program profiling ("profiling instruments"). A few examples of program profiling include analyzing memory use by a program, measuring the frequency of a function call, measuring the duration of an invoked function, determining execution path, and determining call context. Some instruments modify the testing environment. Examples of modifying the test environment include limiting available memory for a program and running the program multiple times. Some instruments modify a program's behavior. Although some instruments, such as profiling instruments, can be run concurrently, those instruments that modify program behavior should not or cannot be run concurrently. These instructions should not or cannot be run concurrently because the instruments interfere with each other by modifying program behavior.

A testing system can classify the test instruments based on whether their functionality affects or interferes with other instruments. The testing system defines concurrency constraints for each classification of instrument. The system classifies instruments that modify behavior of a program and/or interfere with another instrument as Exclusive Instruments. The system enforces a concurrency constraint for Exclusive Instruments that prevents concurrent execution of Exclusive Instruments. The testing system classifies instruments that do not interfere with other instruments as Passive Instruments. The system allows Passive Instruments to be concurrently executed. The testing system classifies instruments that do not that are neither exclusive nor passive as Active Instruments. Developers define sub-classes for the Active Instrument class to be mutually exclusive. The testing system will prevent instruments in the same sub-class of the Active Instrument class from executing concurrently.

Figure 1:
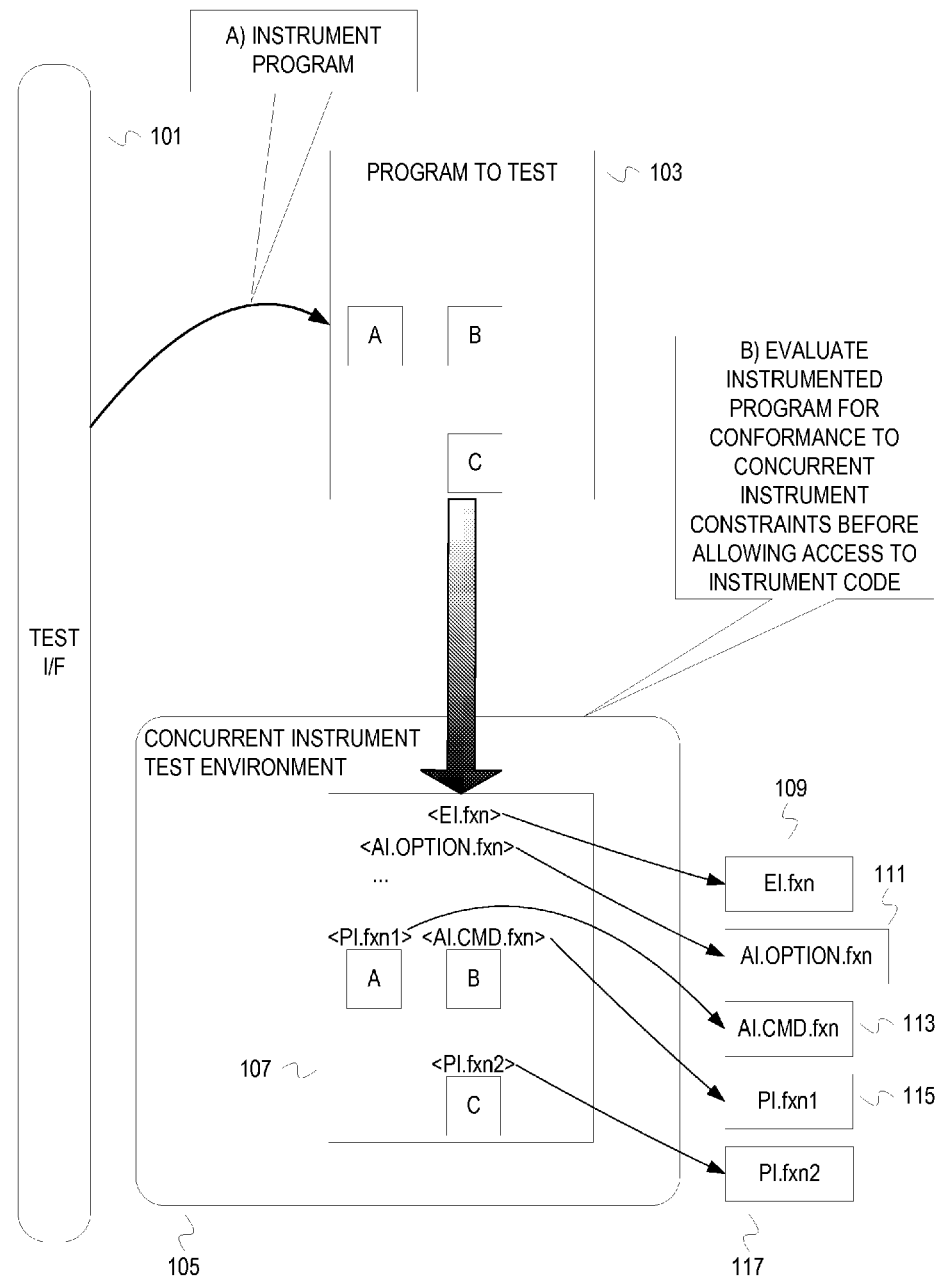
FIG. 1 depicts an example conceptual diagram of a testing system that enforces classification based concurrency constraints.

FIG. 1 depicts an example conceptual diagram of a testing system that enforces classification based concurrency constraints. The testing system includes a test interface 101 and a concurrent instrument test environment 105. The test interface 101 accepts input from a user or file. The test interface 101 inserts instruments into a program responsive to received input. In FIG. 1, the test interface 101 instruments a program 103 at a stage A. The test interface 101 presents a user a series of menus for selecting previously defined instruments and an editor to write instruments. When a user writes an instrument, the test interface 101 guides the user to classify the instrument.

In FIG. 1, the program 103 is depicted with code fragments A, B, and C. These code fragments are presented merely for illustrative purposes. Instrumentation of the program 103 yields an instrument program 107. The instrumented program 107 is depicted with instruments "EI.fxn," "AI.OPTION.fxn," "PI.fxn1," "PI.fxn2," and "AI.CMD.fxn." The test interface 101 inserted the instrument PI.fxn1 before the code fragment A. The test interface 101 inserted the instrument AI.CMD.fxn before the code fragment B. The test interface 101 inserted the instrument PI.fxn2 before the code fragment C. The "EI" instrument is classified as an Exclusive Instrument. The "PI" instruments are classified as Passive Instruments. The "AI" instruments are classified as Active Instruments. The "AI" instruments are further classified into sub-classes "CMD" and "OPTION." The CMD sub-class encompasses instruments that set commands for a testing system when testing a program. The OPTION sub-class encompasses instruments that set options for the testing system when testing a program. This example depicts instruments that invoke instrument program instructions defined separately from the testing system, although embodiments are not so limited. The "EI.fxn" instrument invokes a test module 109 or test program instructions referred to as "EI.fxn." The "AI.OPTION.fxn," instrument invokes a test module 111 referred to as "AI.OPTION.fxn." The "AI.CMD.fxn," instrument invokes a test module 113 referred to as "AI.CMD.fxn." The "PI.fxn1" instrument invokes a test module 115 referred to as "PI.fxn1." The "PI.fxn2" instrument invokes a test module 117 referred to as "PI.fxn2."

At stage B, the concurrent instrument test environment 105 evaluates the instrumented program 107 for conformance to concurrent instrument constraints before allowing access to the instrument program instructions or test modules. The concurrent instrument test environment 105 evaluates the instrumented program 107 for compliance with the current instrument constraints before testing the instrumented program 107. In some embodiments, the concurrent instrument test environment 107 ensures compliance before testing begins. In some embodiments, the concurrent instrument test environment 107 ensures constraint compliance while testing. Some embodiments implement the concurrent instrument test environment as an abstract constructor or a factory object for the instruments. The factory object defines methods for creating each class of instrument. For the Active Instrument class, another abstract constructor can be defined with concrete constructors for each of the sub-classes.

Figure 2:
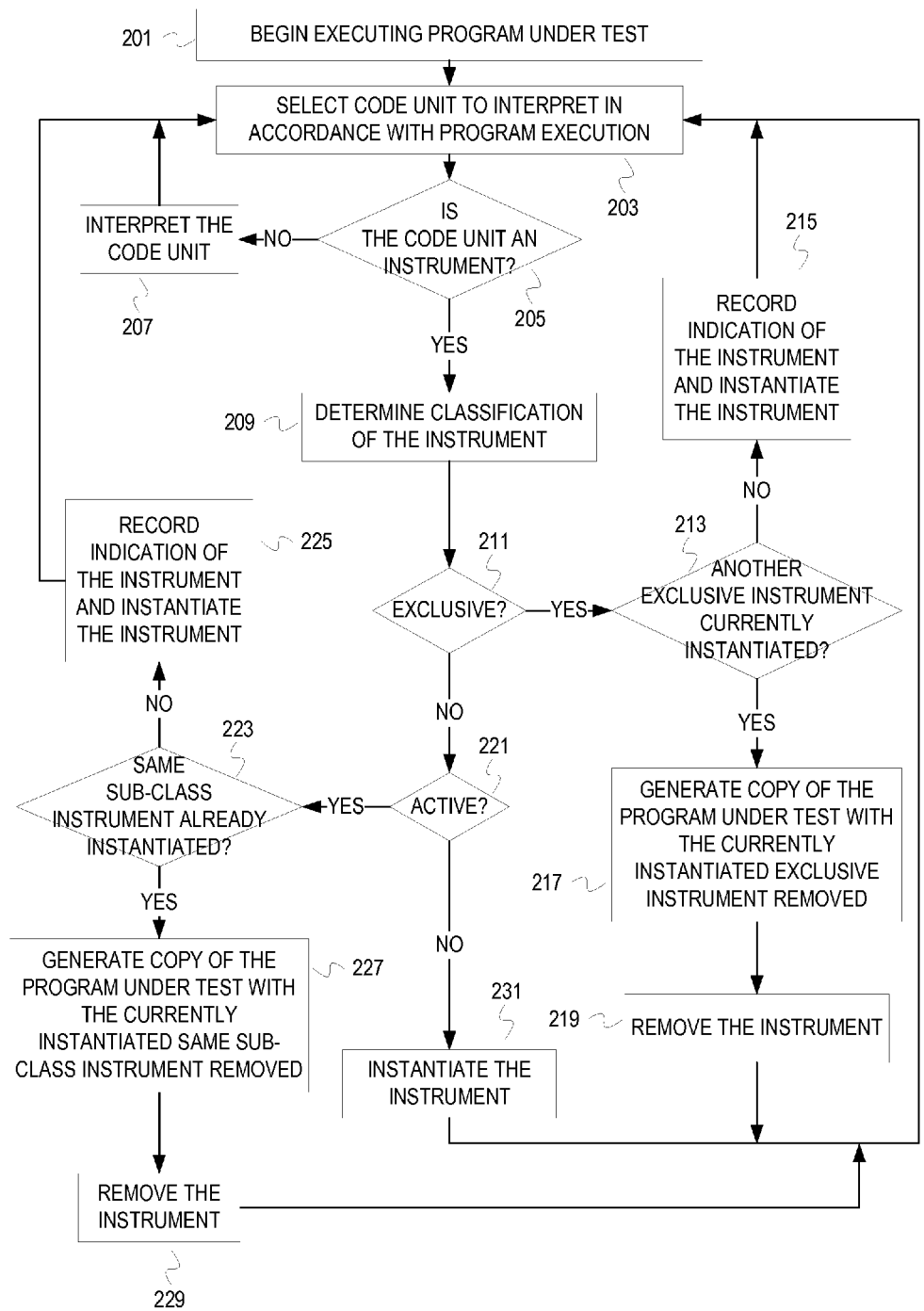
FIGS. 2 and 3 depict flowcharts of example operations for different paradigms of evaluating a program for compliance with concurrent instrument constraints.
Figure 3:
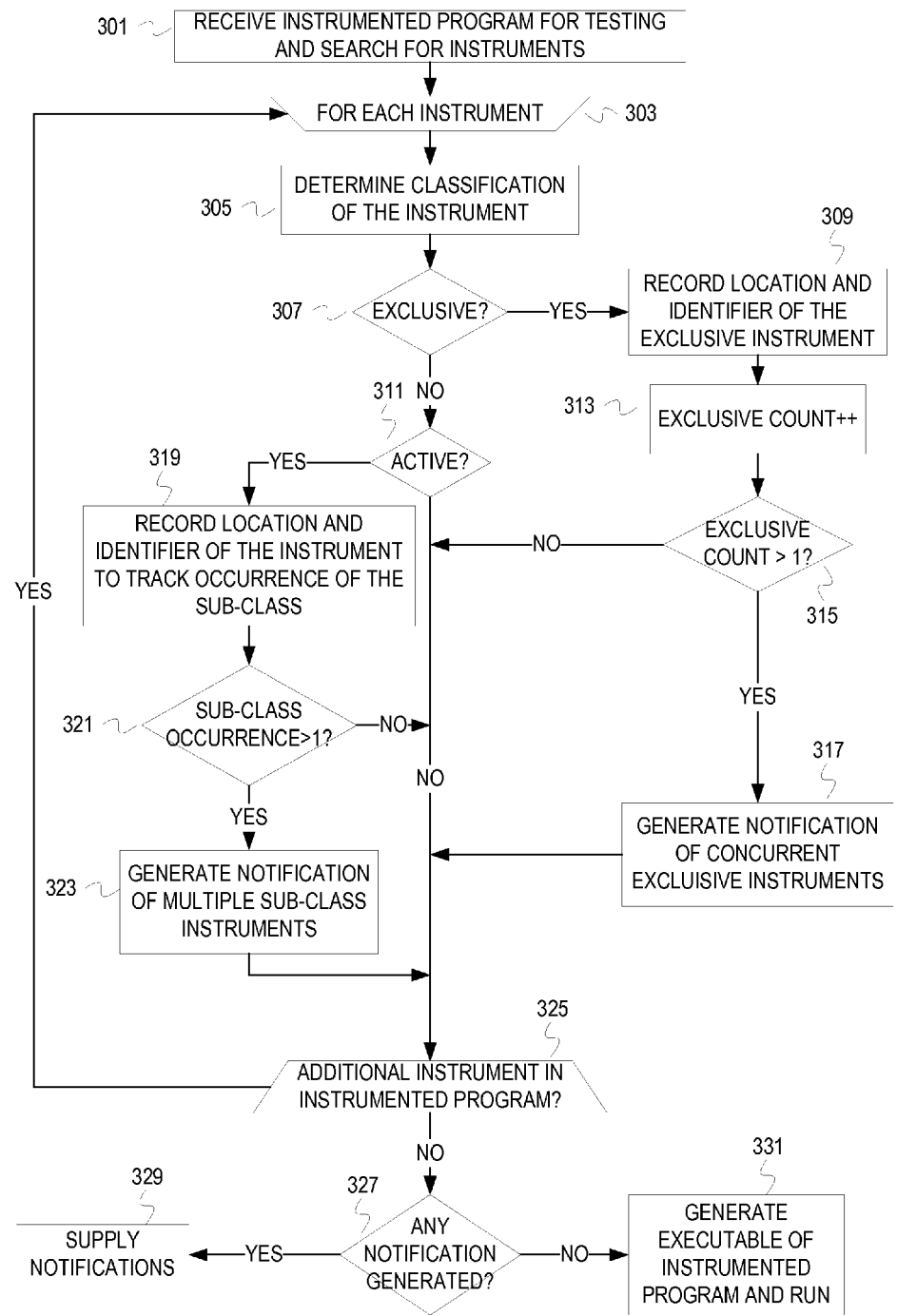

FIGS. 2 and 3 depict flowcharts of example operations for different paradigms of evaluating a program for compliance with concurrent instrument constraints. Some testing tools or test suites generate a binary from an instrumented program and run the binary. Some testing tools or test suites run as an interpreter or just-in-time compiler while testing a program. With these different testing procedures, enforcement of classification based concurrent instrument constraints can take different forms.

FIG. 2 depicts a flowchart of example operations for enforcing concurrent instrument constraints as each code unit of a program is run. A code unit may be a line of code, a module, a pre-defined block, etc. At block 201, a testing tool begins executing a program under test.

At block 203, the testing tool selects a code unit to interpret in accordance with program execution. The testing tool selects a next line of code or next function to be interpreted.

At block 205, the testing tool determines whether the code unit is a test instrument. For example, the testing unit determines whether the code unit begins with or includes a string that corresponds to an instrument classification. In some embodiments, the testing tool can check comments for a flag that indicates the code unit is an instrument. In some embodiments, instruments are distinguished from the program with markers or delimiters. If the code unit is a test instrument, then control flows to block 209. Otherwise, control flows to block 207.

At block 207, the selected code unit is interpreted. Control flows from block 207 back to block 203.

At block 209, the testing tool determines a classification of the instrument. The testing tool can perform string compares against names of the classes. The operation of determining the classification may be incorporated within determining whether the code unit is an instrument in block 205. For example, if the code unit did not indicate one of the classifications, then the code unit was determined not to be an instrument. When determining that the code unit is an instrument, the testing tool may at the same time determine the classification.

At block 211, the testing tool determines whether the instrument is an exclusive instrument. If the instrument is an exclusive instrument, then control flows to block 213. If the instrument is not an exclusive instrument, then control flows to block 221.

At block 213, the testing tool determines whether another exclusive instrument is currently instantiated. The testing tool tracks instantiation of instruments. For example, the testing tool increments a counter when an exclusive instrument is instantiated and decrements the counter when the exclusive instrument is terminated. In some embodiments, the testing tool instantiates an exclusive instrument with a specific process identifier and/or in a specific execution space. If the process identifier is active or the execution space is not empty, then another exclusive instrument is currently instantiated or running. If another exclusive instrument is currently instantiated, then control flows to block 217. If another exclusive instrument is not currently instantiated, then control flows to block 215.

At block 215, the testing tool records an indication of the instrument and instantiates the instrument. Recording an indication of the instrument can take different forms, examples of which include incrementing an exclusive instrument counter and recording location of the instrument and name of the instrument. Control flows back to block 203 from block 215.

At block 217, the testing tool generates a copy of the program under test with the currently instantiated exclusive instrument removed. Since instantiation of the currently selected exclusive instrument would violate the concurrent instrument constraint for exclusive instruments, the testing tool generates a different version of the instrumented program that would allow the currently selected exclusive instrument to be instantiated. The different version removes the currently instantiated exclusive instrument. Hence, testing results can be generated for both exclusive instruments. In some embodiments, the testing tool generates a notification of the conflict and conditions creation of the different instrumented program on a response from the developer. In some embodiments, the testing tool can be configured to generate different versions of the instrumented program when a constraint violation is detected, remove the violating instrument, and/or generate a notification or log event. The testing tool can also be configured to run the different version of the instrumented program upon completion of running the current instrumented program.

At block 219, the instrument is removed from the program. The testing tool deletes or comments out the exclusive instrument of the currently selected code unit. Embodiments do not necessarily remove the instrument. Embodiments can move on to the next code unit. Control flows from block 219 back to block 203.

If the currently selected instrument was determined not to be classified as an exclusive instrument at block 211, then the testing tool determines whether the currently selected instrument is classified as an active instrument at block 221. If the instrument is classified as an active instrument, then control flows to block 223. If the instrument is not classified as an active instrument, then control flows to block 231.

At block 223, the testing tool determines whether the currently selected instrument is classified in a sub-class of another instrument that is already instantiated. For example, an instrument that commands the testing tool to run the instrumented program twice is classified as an Active Instrument and within a sub-class for instruments that set execution commands, which will be referred to as the "ExecCommand" sub-class. The testing tool tracks instantiation of the different sub-classes of the Active Instrument class. The testing tool checks a counter for instantiated ExecCommand intruments. If the currently selected instrument is within the ExecCommand sub-class and the counter for the ExecComand sub-class indicates that another ExecCommand instrument has been instantiated and not terminated (e.g., the counter is 1), then the testing tool determines that another instrument within the same sub-class has been instantiated and control flows to block 227. If the currently selected instrument is in a different sub-class, then control flows to block 225.

At block 225, the testing tool records an indication of the instrument and instantiates the currently selected instrument. An example of recording an indication of the instrument includes recording the sub-class name, associating a counter with the sub-class name, and incrementing the counter. Recording an indication of the instrument can also include recording location of the instrument. In some embodiments, the testing tool does not maintain a counter, but records an identifier of the sub-class when an instrument of the sub-class is instantiated. Control flows back to block 203 from block 205.

At block 227, the testing tool generates a copy of the program under test with the currently instantiated same sub-class instrument removed. Since instantiation of the currently selected active instrument would violate the concurrent instrument constraint for active instruments in a same sub-class, the testing tool generates a different version of the instrumented program that would allow the currently selected active instrument to be instantiated. The different version removes the currently instantiated same sub-class active instrument. As with the exclusive instrument, testing results can be generated for both active instruments in the same sub-class. In some embodiments, the testing tool generates a notification of the conflict and conditions creation of the different instrumented program on a response from the developer. In some embodiments, the testing tool can be configured to generate different versions of the instrumented program when a constraint violation is detected, remove the violating instrument, and/or generate a notification or log event. The testing tool can also be configured to run the different version of the instrumented program upon completion of running the current instrumented program.

At block 229, the instrument of the currently selected code unit is removed from the instrumented program. As with block 219, the testing tool can comment out the instrument, delete the instrument, or skip over the instrument. Control flows from block 229 back to block 203.

FIG. 3 depicts a flowchart of example operations for enforcing concurrent instrument constraints on an instrumented program before running the instrumented program in a test environment. As stated earlier, a testing tool may compile an instrumented program into executable binary. Hence, a testing tool evaluates the instrumented program for compliance with concurrent instrument constraints. At block 301, the testing tool receives an instrumented program for testing. The testing tool searches the instrumented program for instruments. For example, the testing tool searches the instrumented program for class names that correspond to test instruments. As another example, the testing tool searches for demarcations or markers for instruments. In another example, the testing tool records locations of instruments as they are inserted. In that case, the testing tool can jump to each location.

At block 303, a loop of operations begins for each instrument in the instrumented program.

At block 307, the testing tool determines whether the instrument is an exclusive instrument. The testing tool can analyze the instrument to determine whether the instrument includes an identifier or name that represents the Exclusive instrument class. If the instrument is not an Exclusive instrument, then control flows to block 311. If the instrument is an exclusive instrument, then control flows to block 309.

At block 309, the testing tool records location and an identifier of the exclusive instrument. For example, the testing tool records a line number and the instrument name.

At block 313, the testing tool increments a count of exclusive instruments. In some embodiments, the instrument identifiers include information that indicates classification of the instrument. If the instrument identifier indicates the classification, then the testing tool can uses the instrument identifier to track exclusive instruments without a counter.

At block 315, the testing tool determines whether the exclusive instrument count is greater than 1. If the exclusive count is greater than 1, then control flows to block 317. Otherwise, control flows to block 325.

At block 317, the testing tool generates a notification that the instrumented program has exclusive instruments that will be instantiated concurrently. The testing tool creates a message or log entry that indicates the concurrent constraint violation and the exclusive instruments. The notification can be supplied upon detection of the violation in order to allow a user to decide which of the exclusive instruments to remove. In some embodiments, the information is provided after the instrumented program has been evaluated to give the user a global view of concurrent constraint violations. Control flows from block 317 to block 325.

If the testing tool determined that the instrument was not exclusive at block 307, then the testing tool determines if the instrument is an active instrument at block 311. If the instrument is an active instrument, then control flows to block 319. If the instrument is neither an active instrument nor an exclusive instrument, then control flows to block 325. This flowchart example presumes that the only remaining classification is a passive instrument, which has no concurrency constraints in this example. Embodiments are not so limited, however. Embodiments can implement additional instrument classes beyond Exclusive and Active.

At block 319, the testing tool records location and an identifier of the instrument to track occurrence of the sub-class. The identifier of the active instrument indicates a representation of the sub-class. For example, the identifier includes an indication of the Active instrument class, a demarcation, and then the sub-class.

At block 321, the testing tool determines whether the sub-class has occurred more than once. The testing tool can maintain a list of sub-class identifiers encountered in the instrumented program. When the testing tool encounters an Active instrument, the testing tool compares the instrument sub-class to the list. If the sub-class is already represented in the list, then the instrument would violate the concurrent instrument constraints for that sub-class. Otherwise, the testing tool records an indication of the sub-class of the Active instrument in the list. If the testing tool determines that the same sub-class has already been encountered in the instrumented program then control flows to block 323. If the testing tool has not previously encountered the same sub-class, then control flows to block 325.

At block 325, the testing tool determines whether there are additional instruments in the instrumented program to evaluate. If there are still instruments to evaluate, then control flows back to block 303. If the testing tool has evaluated all of the instruments in the instrumented program, then control flows to block 327.

At block 327, the testing tool determines whether any notifications have been generated. If no notifications have been generated, then control flows to block 331. If notifications have been generated, then control flows to block 329.

At block 331, the testing tool generates an executable of the instrumented program and runs the executable.

At block 329, the testing tool supplies the notifications. For example, the testing tool displays the notifications in a user interface. As stated earlier, the notifications can be displayed as they are generated instead of accumulating the notifications. As another example of supplying the notifications, the testing tool records the notifications in an evaluation log.

The flowcharts in this description are provided to aid in understanding embodiments and should not be used to limit embodiments or scope of the claims. Embodiments can perform some of the operations depicted in the flowcharts in a different order, in parallel; can perform different operations;

and can perform fewer operations. For instance, the operations depicted in blocks 209, 211 and 221 can be partially merged. Determining that an instrument is an exclusive instrument determines that a code unit is an instrument while at the same time determining the classification. In FIG. 3, additional operations can be performed to determine whether an exclusive instrument has limited duration during execution of the instrumented program. In the case of a limited duration for an Exclusive instrument or sub-class of Active instrument, additional operations can be performed to determine whether exclusive instruments are concurrent and whether same sub-class Active instruments are concurrent. Thus, notifications would be generated when concurrency is detected for these scenarios. And notifications would not be generated if an instrumented program has multiple exclusive instruments that will not be instantiated concurrently. Similarly, notifications would not be generated for multiple same sub-class Active instruments that will not run concurrently.

As will be appreciated by one skilled in the art, aspects of the present inventive subject matter may be embodied as a system, method or computer program product. Accordingly, aspects of the present inventive subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present inventive subject matter may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device. A computer readable storage medium does not include transitory, propagating signals.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present inventive subject matter may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present inventive subject matter are described with reference to flowchart illustrations and/or block diagrams of methods, apparatus (systems) and computer program products according to embodiments of the inventive subject matter. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 4:
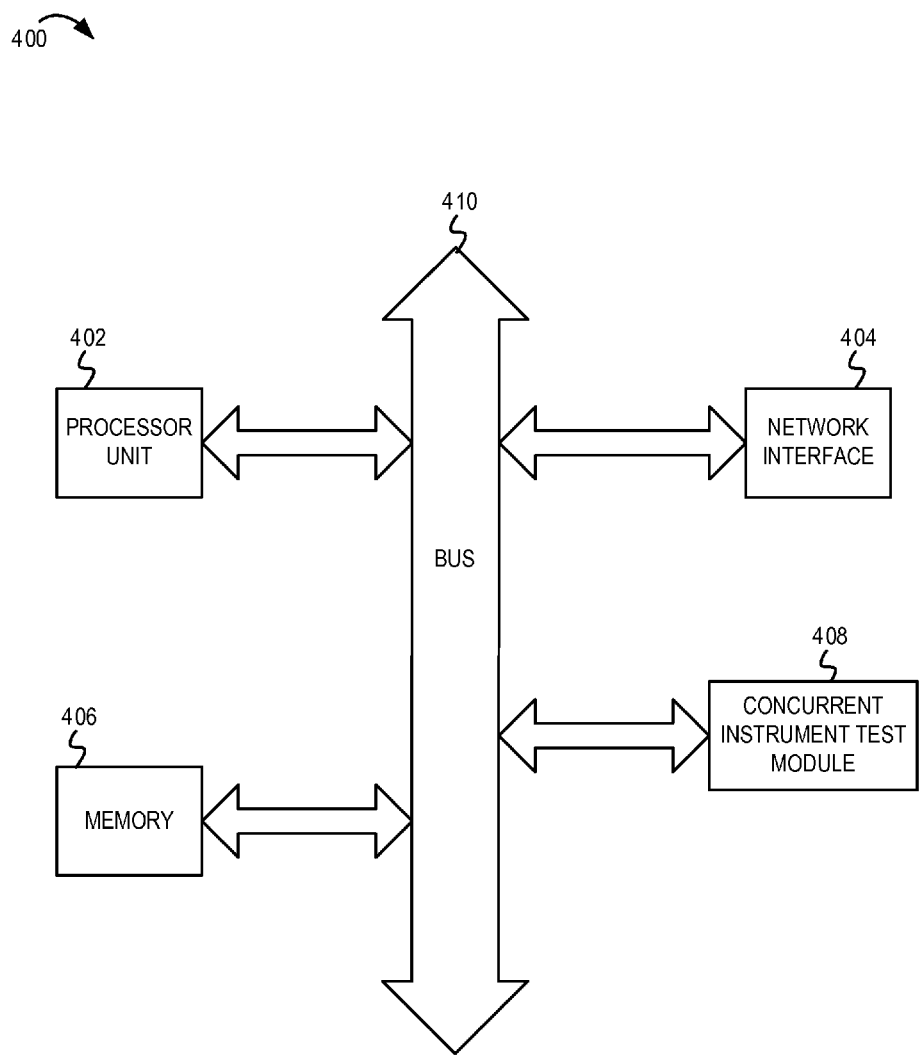
FIG. 4 depicts an example computer system 400.

FIG. 4 depicts an example computer system 400. The computer system 400 includes a processor unit 402 (possibly including multiple processors, multiple cores, multiple nodes, and/or implementing multi-threading, etc.). The computer system 400 includes a memory 406. The memory 406 may be main memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the above already described possible realizations of machine-readable media. The computer system also includes a bus 410 (e.g., PCI, ISA, PCI-Express, HyperTransport® bus, Infini-Band® bus, NuBus, etc.), a network interface 404 (e.g., an ATM interface, an Ethernet interface, a Frame Relay interface, SONET interface, wireless interface, etc.), and a concurrent instrument test module 408. The concurrent instrument test module 408 determines classification of instruments in an instrumented program and enforces concurrency constraints on the instruments based on the classifications. The concurrent instrument test module 408 can enforce the concurrency constraints by limiting instantiation of instruments based on the classification based concurrency constraints. Limiting instantiation can be limiting access to test code or test program instructions. The concurrent instrument test module 408 may be a hardware chip (e.g., PLA, PAL, FPGA, etc.) programmed with program instructions to perform the functionality as described above. The concurrent instrument test module 408 may be implemented with an application specific integrated circuit, in logic implemented in the processor unit 402, in a co-processor on a peripheral device or card, etc. In addition, at least some of the functionality of the concurrent instrument test module 408 may be embodied as program instructions in the memory 406 or a storage device(s). Further, realizations may include fewer or additional components not illustrated in FIG. 4 (e.g., video cards, audio cards, additional network interfaces, peripheral devices, etc.). The processor unit 402 and the network interface 404 are coupled to the bus 410. Although illustrated as being coupled to the bus 410, the memory 406 may be coupled to the processor unit 402.

While the embodiments are described with reference to various implementations and exploitations, it will be understood that these embodiments are illustrative and that the scope of the inventive subject matter is not limited to them. In general, techniques for classification based concurrent instrument constraints as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the inventive subject matter. In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the inventive subject matter.

What is claimed is:

1. A computer program product for classification based concurrent test instrumentation of an instrumented program to be tested, the computer program product comprising:
   a computer readable storage medium having computer usable program code embodied therewith, the computer usable program code comprising a computer usable program code to:
      determine classifications of a plurality of test instruments in an instrumented program, wherein the plurality of test instruments at least includes a first test instrument and a second test instrument in a first classification of the classifications and the plurality of test instruments includes at least a third test instrument and a fourth test instrument in a second classification of the classifications;
      instantiate the first test instrument in the instrumented program;
      increment a counter for the first classification after the instantiation of the first test instrument and decrement the counter for the first classification when the first test instrument is no longer active;
      prevent concurrent instantiation, in the instrumented program, of the second test instrument with the first test instrument based, at least in part, on the first and second test instruments being in the first classification, wherein the program code to prevent concurrent instantiation, in the instrumented program, of the second test instrument with the first test instrument comprises program code to,
         determine that the instrumented program is attempting to instantiate the second test instrument;
         determine that the first test instrument is currently instantiated for the instrumented program, wherein program code to determine that the first test instrument is currently instantiated for the program comprises program code to determine that the counter for the first classification is greater than zero;
         prevent access to code of the second test instrument in response to a determination that the first test instrument is currently instantiated;
      concurrently instantiate, in the instrumented program, the third and fourth test instruments based, at least in part, on the third and fourth test instruments being in the second classification;
      create a copy of the instrumented program with an indication that prevents instantiation of the first test instrument in the copy and that allows instantiation of the second test instrument; and
      instantiate the second test instrument in the copy.

2. The computer program product of claim 1, wherein the computer usable program code further comprises program code to:
   determine sub-classes of a set of the plurality of test instruments classified in a third classification of the classifications; and
   prevent concurrent instantiation of multiple of the set of the plurality of test instruments in same ones of the sub-classes.

3. The computer program product of claim 2, wherein the computer usable program code configured to determine the sub-classes of the set of the plurality of test instruments classified in the third classification of the classifications comprises the computer usable program code to: for each of the set of the plurality of test instruments, determine an identifier of the test instrument and determine which of the sub-classes the identifier indicates.

4. The computer program product of claim 1, wherein the computer usable program code to determine the classifications of the plurality of test instruments in the instrumented program comprises the computer usable program code configured to:
   for each of the plurality of test instruments, determine an identifier of the test instrument and determine which of the classifications the identifier indicates.

5. The computer program product of claim 1, wherein the computer usable program code configured to prevent instantiation of the second test instrument comprises the computer usable program code to, one of, delete the second test instrument, comment out the second test instrument, and skip execution of the second test instrument.

6. The computer program product of claim 1 wherein the computer usable program code is further configured to track instantiations of test instruments for each of the plurality of classifications.

7. An apparatus comprising:
a processor;
a storage device coupled with the processor; and
a concurrent instrument test module operable to,
- determine classifications of a plurality of test instruments in an instrumented program, wherein the plurality of test instruments at least includes a first test instrument and a second test instrument in a first classification of the classifications and the plurality of test instruments includes at least a third test instrument and a fourth test instrument in a second classification of the classifications;
- instantiate the first test instrument in the instrumented program;
- increment a counter for the first classification after instantiation of the first test instrument and decrement the counter for the first classification when the first test instrument is no longer active;
- prevent concurrent instantiation, in the instrumented program, of the second test instrument with the first test instrument based, at least in part, on the first and second test instruments being in the first classification, wherein the concurrent instrument test module operable to prevent concurrent instantiation, in the instrumented program, of the second test instrument with the first test instrument comprises the concurrent instrument test module operable to,
  - determine that the instrumented program is attempting to instantiate the second test instrument;
  - determine that the first test instrument is currently instantiated for the instrumented program, wherein the concurrent instrument test module operable to determine that the first test instrument is currently instantiated for the program comprises the concurrent instrument test module operable to determine that the counter for the first classification is greater than zero;
- prevent access to code of the second test instrument in response to a determination that the first test instrument is currently instantiated;
- concurrently instantiate, in the instrumented program, the third and fourth test instruments based, at least in part, on the third and fourth test instruments being in the second classification;
- create a copy of the instrumented program with an indication that prevents instantiation of the first test instrument in the copy and that allows instantiation of the second test instrument; and
- instantiate the second test instrument in the copy.

8. The apparatus of claim 7 further comprising a computer readable storage medium encoded with program instructions that embody the concurrent instrument test module.

9. The apparatus of claim 7, wherein the concurrent test instrument module is further operable to:
- determine sub-classes of a set of the plurality of test instruments classified in a third classification of the classifications; and
- prevent concurrent instantiation of multiple of the set of the plurality of test instruments in same ones of the sub-classes.

10. The apparatus of claim 9, wherein said determine the sub-classes of the set of the plurality of test instruments classified in the third classification of the classifications comprises a concurrent instrument test module operable to, for each of the set of the plurality of test instruments, determine an identifier of the test instrument and determining which of the sub-classes the identifier indicates.

11. The apparatus of claim 7, wherein said determine the classifications of the plurality of test instruments in the instrumented program comprises a concurrent instrument test module operable to, for each of the plurality of test instruments, determine an identifier of the test instrument and determine which of the classifications the identifier indicates.

12. The apparatus of claim 7, wherein said prevent instantiation of the second test instrument comprises a concurrent instrument test module operable to do one of delete the second test instrument, comment out the second test instrument, and skip execution of the second test instrument.

13. The apparatus of claim 7 further comprising a concurrent instrument test module operable to track instantiations of test instruments for each of the plurality of classifications.

* * * * *